(12) United States Patent
Hathorn et al.

(10) Patent No.: US 8,381,067 B2
(45) Date of Patent: Feb. 19, 2013

(54) APPARATUS, SYSTEM, AND METHOD FOR SPECIFYING INTERMEDIATE CRC LOCATIONS IN A DATA STREAM

(75) Inventors: Roger G. Hathorn, Tucson, AZ (US); Matthew J. Kalos, Tucson, AZ (US); Louis W. Ricci, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 12/697,025

(22) Filed: Jan. 29, 2010

(65) Prior Publication Data

US 2011/0191660 A1    Aug. 4, 2011

(51) Int. Cl.
*H03M 13/00* (2006.01)
(52) U.S. Cl. .................. 714/758; 714/747; 714/701
(58) Field of Classification Search .................. 714/758, 714/747, 701, 100, 20, 6, 21
See application file for complete search history.

(56) References Cited

U.S. PATENT DOCUMENTS

| | | | |
|---|---|---|---|
| 7,219,294 B2 * | 5/2007 | Vogt | 714/758 |
| 7,237,141 B2 * | 6/2007 | Fredin | 714/6.21 |
| 7,447,953 B2 * | 11/2008 | Vogt | 714/716 |
| 2009/0210769 A1 | 8/2009 | Casper et al. | |

OTHER PUBLICATIONS

Ian Neville, High Performance FICON for System z Technical summary for customer planning, IBM, System z Hight Performance FICON customer readiness documentation, Jan. 2009.

* cited by examiner

*Primary Examiner* — Fritz Alphonse
(74) *Attorney, Agent, or Firm* — Kunzler Law Goup, PC

(57) ABSTRACT

An apparatus, system, and method are disclosed for determining the location of intermediate CRC in a data stream sent from a channel subsystem to a control unit of an I/O processing system. A CRC locating module determines the location of at least one intermediate CRC in a transport data information unit. A CRC offset module determines a CRC offset of the at least one intermediate CRC. The CRC offset is a value identifying the difference between the location of the at least one intermediate CRC and the location of the first byte of user data in the transport data information unit. An offset block creation module creates a CRC offset block which includes a CRC offset value for each of the at least one intermediate CRC within the transport data information unit and a transmission module transmits the COB to a control unit in the I/O processing system.

26 Claims, 8 Drawing Sheets

APPARATUS, SYSTEM, AND METHOD FOR SPECIFYING INTERMEDIATE CRC LOCATIONS IN A DATA STREAM

FIELD

This invention relates to input/output processing and more particularly relates to a method, system, and apparatus for determining the location of intermediate cyclic redundancy check (CRC) in a data stream.

BACKGROUND

Description of the Related Art

Input/output (I/O) operations are used to transfer data between memory and I/O devices of an I/O processing system. Specifically, data is written from memory to one or more I/O devices, and data is read from one or more I/O devices to memory by executing I/O operations.

To facilitate processing of I/O operations, an I/O subsystem of the I/O processing system is employed. The I/O subsystem is coupled to main memory and the I/O devices of the I/O processing system and directs the flow of information between memory and the I/O devices. One example of an I/O subsystem is a channel subsystem. The channel subsystem uses channel paths as communications media. Each channel path includes a channel coupled to a control unit, the control unit being further coupled to one or more I/O devices.

The channel subsystem may employ zHPF (High Performance FICON) to execute channel programs containing a large number of Device Command Words (DCWs) or single DCWs that write multiple variable length records or tracks. In order for an I/O device to commit a write of a record or track of data, it must first be able to check the integrity of the data. The ability to check the integrity of individual blocks (records, tracks) of data is accomplished by inserting intermediate CRCs after each such block of data.

A method is required for the I/O device to determine the location of the intermediate CRCs in the data stream. Existing methods are based on knowledge of the device command set and the format of the data written by these commands. It would be beneficial to develop an approach that allows a device to be able to determine the locations of the intermediate CRCs independent of the device commands. Such an approach would allow the I/O device to check intermediate CRCs without first processing the commands. Accordingly, there is a need in the art for determining the location of the intermediate CRCs in an I/O processing data stream independent of the device commands.

BRIEF SUMMARY

From the foregoing discussion, it should be apparent that a need exists for an apparatus, system, and method that allow an I/O device to determine the location of intermediate CRC in a data stream. Beneficially, such an apparatus, system, and method would be able to determine the locations of the CRCs independent of the device commands so that CRC checking can be done without first processing the commands.

The present invention has been developed in response to the present state of the art, and in particular, in response to the problems and needs in the art that have not yet been fully solved by currently available intermediate CRC locating methods. Accordingly, the present invention has been developed to provide an apparatus, system, and method for determining the location of intermediate CRC in a data stream that overcome many or all of the above-discussed shortcomings in the art.

The apparatus to determine the location of intermediate CRC in a data stream is provided with a plurality of modules configured to functionally execute the steps necessary to communicate the location of the intermediate CRCs from a channel subsystem to a control unit of an I/O processing system. These modules in the described embodiments include a CRC locating module, a CRC offset module, an offset block creation module, and a transmission module. The CRC locating module, in one embodiment, determines the location of at least one intermediate CRC in a transport data information unit. The CRC offset module determines a CRC offset of the at least one intermediate CRC. In certain embodiments the CRC offset is a value identifying the difference between the location of the at least one intermediate CRC and the location of the first byte of user data in the transport data information unit. The offset block creation module creates a CRC offset block (COB) which includes a CRC offset value for each of the at least one intermediate CRC within the transport data information unit. The transmission module transmits the COB to a control unit in the I/O processing system.

In certain embodiments the apparatus also includes a count module that determines a control data count. In certain embodiments the control data count determines the location of the COB. Where the control data count is a non-zero value, the COB may be transferred in a command area immediately following a transfer COB (TCOB) command. Where the control data count is zero, the COB may be transferred in a transport data information unit.

The apparatus, in one embodiment, also includes a COB CRC insertion module that inserts a COB CRC into a data information unit. The COB CRC may include a CRC calculated over the CRC offset values of the COB and may be used to verify the accuracy of the CRC offset values in the COB. In certain embodiments the COB CRC insertion module may insert one or more pad bytes between the COB and the COB CRC to extend the COB CRC to a double word boundary.

In a further embodiment, the apparatus may include an intermediate CRC check module that compares a known location of the at least one intermediate CRC with the CRC offset value contained within the COB for the corresponding at least one intermediate CRC. Where the CRC check module determines that the at least one intermediate CRC is at a location that is inappropriate for a device or command being executed, the CRC check module may present a program check status to the channel subsystem.

In one embodiment the apparatus to determine the location of intermediate CRC in a data stream includes a control unit CRC offset block detection module, a control unit COB location determination module and a control unit CRC position module. The control unit CRC offset block detection module detects the presence of a COB in a data stream. In certain embodiments the COB includes a CRC offset value for each intermediate CRC within a transport data information unit. The CRC offset is a value identifying a difference between the location of the intermediate CRC and a location of a first byte of data in a first transport data information unit. In certain embodiments the control unit COB location determination module determines the location of the COB. The control unit CRC position location module locates a position of the at least one intermediate CRC within a transport information unit using the CRC offset values in the COB.

The control unit COB detection module, in one embodiment, detects the presence of a COB in response to receiving a transfer COB (TCOB) command word in a transport command area of a transport command information unit. The control unit COB location determination module determines the location of the COB based on a control data count in the TCOB command word. Where the control data count comprises a non-zero value the COB is located in the transport command area immediately following the TCOB command. Where the control data count comprises a zero value the COB is located in a data information unit.

In one embodiment the apparatus includes a control unit COB CRC validation module that validates a COB CRC. The COB CRC may include a CRC calculated over the CRC offset values that make up the COB.

In another embodiment the apparatus includes an intermediate CRC check module that compares a known location of the at least one intermediate CRC with the CRC offset value in the COB for the corresponding at least one intermediate CRC. In certain embodiments the intermediate CRC check module presents a program check status in response to the intermediate CRC check module determining that the at least one intermediate CRC is at a location that is inappropriate for a device or a command being executed.

The apparatus, in another embodiment, includes a verify CRC module that calculates a CRC value for the at least one CRC in the transport data information unit to verify the integrity of the data within the transport data information unit. In certain embodiments the data may be transferred in more than one transport data information unit. Thus, in one embodiment the verify CRC module may be configured to calculate a CRC value for CRC's located in many transport data information units.

A computer program product and a method of the present invention are also presented for locating a CRC in a data stream of an input/output I/O processing system. The computer program product and method in the disclosed embodiments substantially include the modules and steps necessary to carry out the functions presented above with respect to the operations of the described apparatus.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
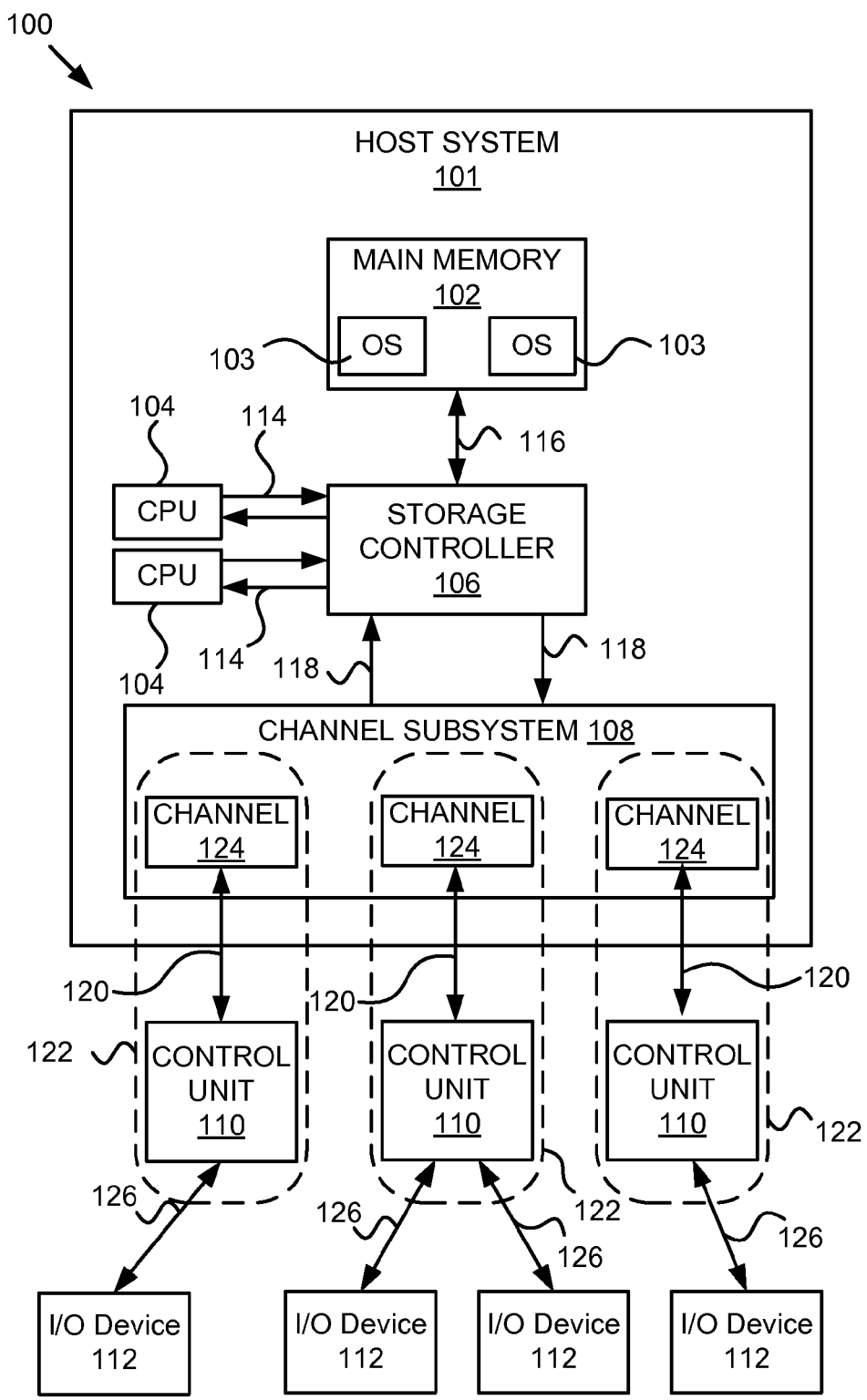
FIG. 1 is a schematic block diagram illustrating one embodiment of an I/O processing system incorporating and using one or more aspects of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable mediums.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Aspects of the present invention are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

In accordance with an aspect of the present invention, I/O processing is facilitated, by reducing communications between components of an I/O processing system used to perform the I/O processing. For instance, the number of exchanges and sequences between an I/O communications adapter, such as a channel, and a control unit is reduced. This is accomplished by sending a plurality of commands from an I/O communications adapter to a control unit as a single entity for execution by the control unit, and by a channel sending the data for the commands, if any, as a single entity. The plurality of commands are included in a block, referred to herein as a transport command control block (TCCB), an address of which is specified in a transport control word (TCW). The TCW is sent from an operating system (OS) or other application to the I/O communications adapter, which in turn forwards the TCCB in a command message to the control unit for processing. The control unit processes each of the commands absent a tracking of status relative to those individual commands by the I/O communications adapter. The plurality of commands is also referred to as a channel program, which is parsed and executed on the control unit rather than the I/O communications adapter.

In an exemplary embodiment, the I/O communication adapter inserts intermediate CRCs in an output data stream transferring a large data block in a message to the control unit. When multiple CRCs are inserted in the output data stream, they provide verification data for separate blocks within the output data stream that are interpreted by the control unit. The CRCs can be inserted in the output data stream at designated insert positions as checkpoints rather than appending a single CRC to the end of a message. One of skill in the art will recognize that in certain embodiments intermediate CRCs can be inserted at any point within the output data stream where it is desirable to check the accuracy of the information contained within the output data stream.

In one embodiment the I/O communications adapter may also insert pad bytes along with each CRC inserted so that the CRCs in the output data stream start and end on specific boundaries. The checkpoint locations can be established via a specification between the OS and the control unit. Through inserting multiple CRCs in the output data stream, the control unit can incrementally verify and perform actions in response to the verified portion of the output data stream rather than waiting for a complete message to be received. Moreover, if an error is detected early in the message, the control unit can react prior to receiving and verifying the complete message.

One example of an I/O processing system incorporating and using one or more aspects of the present invention is described with reference to FIG. 1. I/O processing system 100 includes a host system 101, which further includes for instance, a main memory 102, one or more central processing units (CPUs) 104, a storage controller 106, and a channel subsystem 108. The host system 101 may be a large scale computing system, such as a mainframe or server. The I/O processing system 100 also includes one or more control units 110 and one or more I/O devices 112, each of which is described below.

Main memory 102 stores data and programs, which can be input from I/O devices 112. For example, the main memory 102 may include one or more operating systems (OS s) 103 that are executed by one or more of the CPUs 104. The main memory 102 is directly addressable and provides for high-speed processing of data by the CPUs 104 and the channel subsystem 108.

CPU 104 is the controlling center of the I/O processing system 100. It contains sequencing and processing facilities for instruction execution, interruption action, timing functions, initial program loading, and other machine-related functions. CPU 104 is coupled to the storage controller 106 via a connection 114, such as a bidirectional or unidirectional bus.

Storage controller 106 is coupled to the main memory 102 via a connection 116, such as a bus; to CPUs 104 via connection 114; and to channel subsystem 108 via a connection 118. Storage controller 106 controls, for example, queuing and execution of requests made by CPU 104 and channel subsystem 108.

In an exemplary embodiment, channel subsystem 108 provides a communication interface between host system 101 and control units 110. Channel subsystem 108 is coupled to storage controller 106, as described above, and to each of the control units 110 via a connection 120, such as a serial link. Connection 120 may be implemented as an optical link, employing single-mode or multi-mode waveguides in a Fibre Channel fabric. Channel subsystem 108 directs the flow of information between I/O devices 112 and main memory 102. Channel subsystem 108 relieves the CPUs 104 of the task of communicating directly with the I/O devices 112 and permits data processing to proceed concurrently with I/O processing. The channel subsystem 108 uses one or more channel paths 122 as the communication links in managing the flow of information to or from I/O devices 112. As a part of the I/O processing, channel subsystem 108 also performs the path-management functions of testing for channel path availability, selecting an available channel path 122 and initiating execution of the operation with the I/O devices 112.

Each channel path 122 includes a channel 124 (channels 124 are located within the channel subsystem 108, in one example, as shown in FIG. 1), one or more control units 110 and one or more connections 120. In another example, it is also possible to have one or more dynamic switches (not depicted) as part of the channel path 122. A dynamic switch is coupled to a channel 124 and a control unit 110 and provides the capability of physically interconnecting any two links that are attached to the switch. In another example, it is also possible to have multiple systems, and therefore multiple channel subsystems (not depicted) attached to control unit 110.

Also located within channel subsystem 108 are subchannels (not shown). One subchannel is provided for and dedicated to each I/O device 112 accessible to a program through the channel subsystem 108. A subchannel (e.g., a data structure, such as a table) provides the logical appearance of a device to the program. Each subchannel provides information concerning the associated I/O device 112 and its attachment to channel subsystem 108. The subchannel also provides information concerning I/O operations and other functions involving the associated I/O device 112. The subchannel is the means by which channel subsystem 108 provides information about associated I/O devices 112 to CPUs 104, which obtain this information by executing I/O instructions.

Channel subsystem 108 is coupled to one or more control units 110. Each control unit 110 provides logic to operate and control one or more I/O devices 112 and adapts, through the use of common facilities, the characteristics of each I/O device 112 to the link interface provided by the channel 124. The common facilities provide for the execution of I/O operations, indications concerning the status of the I/O device 112 and control unit 110, control of the timing of data transfers over the channel path 122 and certain levels of I/O device 112 control.

Each control unit 110 is attached via a connection 126 (e.g., a bus) to one or more I/O devices 112. I/O devices 112 receive information or store information in main memory 102 and/or other memory. Examples of I/O devices 112 include card readers and punches, magnetic tape units, direct access storage devices, displays, keyboards, printers, pointing devices, teleprocessing devices, communication controllers and sensor based equipment, to name a few.

Before an I/O operation starts and frames are transmitted over channel path 122, a channel program must be created and passed to the channel subsystem 108. In certain embodiments operating system 103 or other software creates the channel program. The channel program may use transport commands when operating in transport mode, or channel commands when operating in command mode.

A command mode I/O operation uses a channel control word (CCW) to send commands and data over the channel path 122. A CCW specifies a command to be executed, and includes other fields to control processing of the command. Command codes used in CCWs include, for example, read, read backward, control, sense, and write. For CCWs that specify the transfer of data the CCW includes a count field that specifies the number of bytes of data to be transferred as well as a data address that points to a location in main memory 102 that includes the data 206 to be transferred.

A transport mode I/O operation uses a TCW to send commands and data over the channel path 122 and does not use CCWs. To use transport mode the channel 124 and the control unit 110 must support System zHPF. When an I/O request is received and passed to a channel subsystem 108 and a channel 124 is selected, fiber channel architecture and FICON protocols are used to build frames required to send commands and data over the channel path 122.

Figure 2:
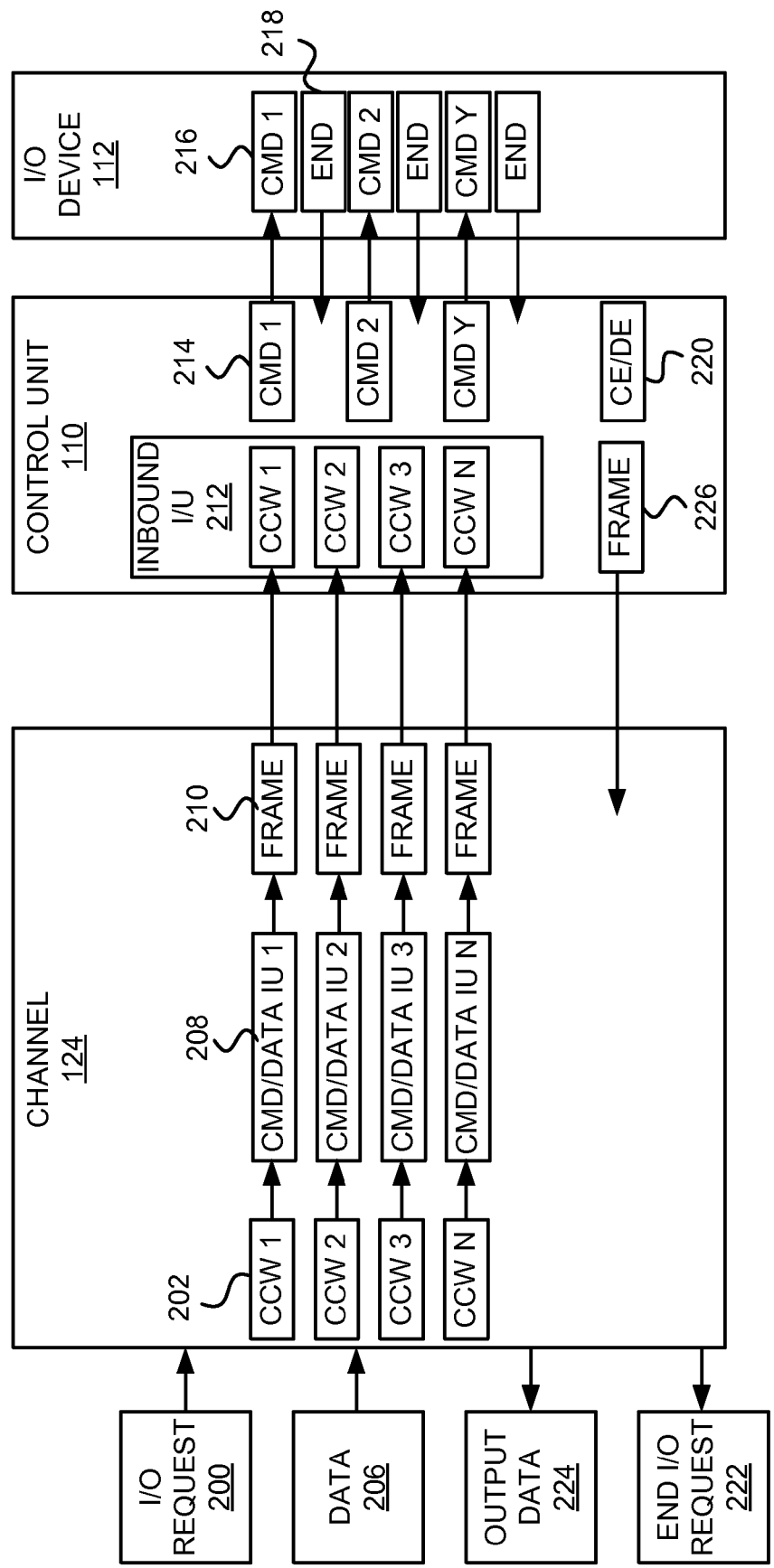
FIG. 2 depicts one embodiment of a link protocol used in communicating between a channel and control unit to execute a command mode I/O operation.

FIG. 2 illustrates an example of the data processing involved in sending commands and data over the channel path 122 using command mode. In operation an I/O request 200 is received at a channel 124 from the channel subsystem 108. The channel 124 retrieves CCWs 202 and associated data 206 from main memory 102. The channel 124 assembles the required parameters, data and fields into information units 208. In command mode processing the channel 124 uses Fibre Channel Single Byte Sets-3 (FC-SB-3) protocols to assemble the information units 208. Fibre Channel Single Byte Sets-4 (FC-SB-4) protocols specify both command mode processing and transport mode processing.

Information associated with the execution of an I/O request 200 and the operation of an I/O device 112 is transferred between the channel 124 and the control unit 110 as information units 208. Information units 208 contain device-level commands, status, data, or other control information or link-level control information. When the channel 124 receives the I/O request 200, the device level functions and protocols are obtained from the CCWs 202 and insert them into the appropriate fields within the information unit 208. When the information unit 208 is ready for transmission, link level functions and protocols provide additional information such as address identifiers and exchange identification and the information units are transferred as frames 210 on the channel path 122. As many frames 210 will be sent to the control unit 110 as it takes to hold the information units 208 data.

Upon receiving the frames 210, the control unit 110 or another channel 124 rebuilds the incoming frames 210 for a given information unit 208 into an inbound information unit 212. Commands 214 are transmitted to I/O device 112 for execution as device commands 216.

A fundamental difference between the embodiment illustrated in FIG. 2 and prior art networking architectures is the CCW chaining capabilities. Prior art systems required a Channel End/Device End (CE/DE) after executing each CCW 202. With FICON channels, such as channel 124 of FIG. 2, the CCWs 202 are transferred to the control unit 110 without waiting for a CE/DE after each CCW 202 execution. After execution of each device command 216 on the I/O device 112, the I/O device 112 may present a logical end 218 to the control unit 110. After the last CCW 202 has been executed by the control unit 110 or the I/O device 112, the control unit presents a CE/DE 220 to the channel 124 via frame 226. Receipt of the CE/DE 220 by the channel 124 indicates that the I/O request is complete 222 and the output data stream 224 generated by the I/O device 112 can be returned or written to main memory 102.

Figure 3:
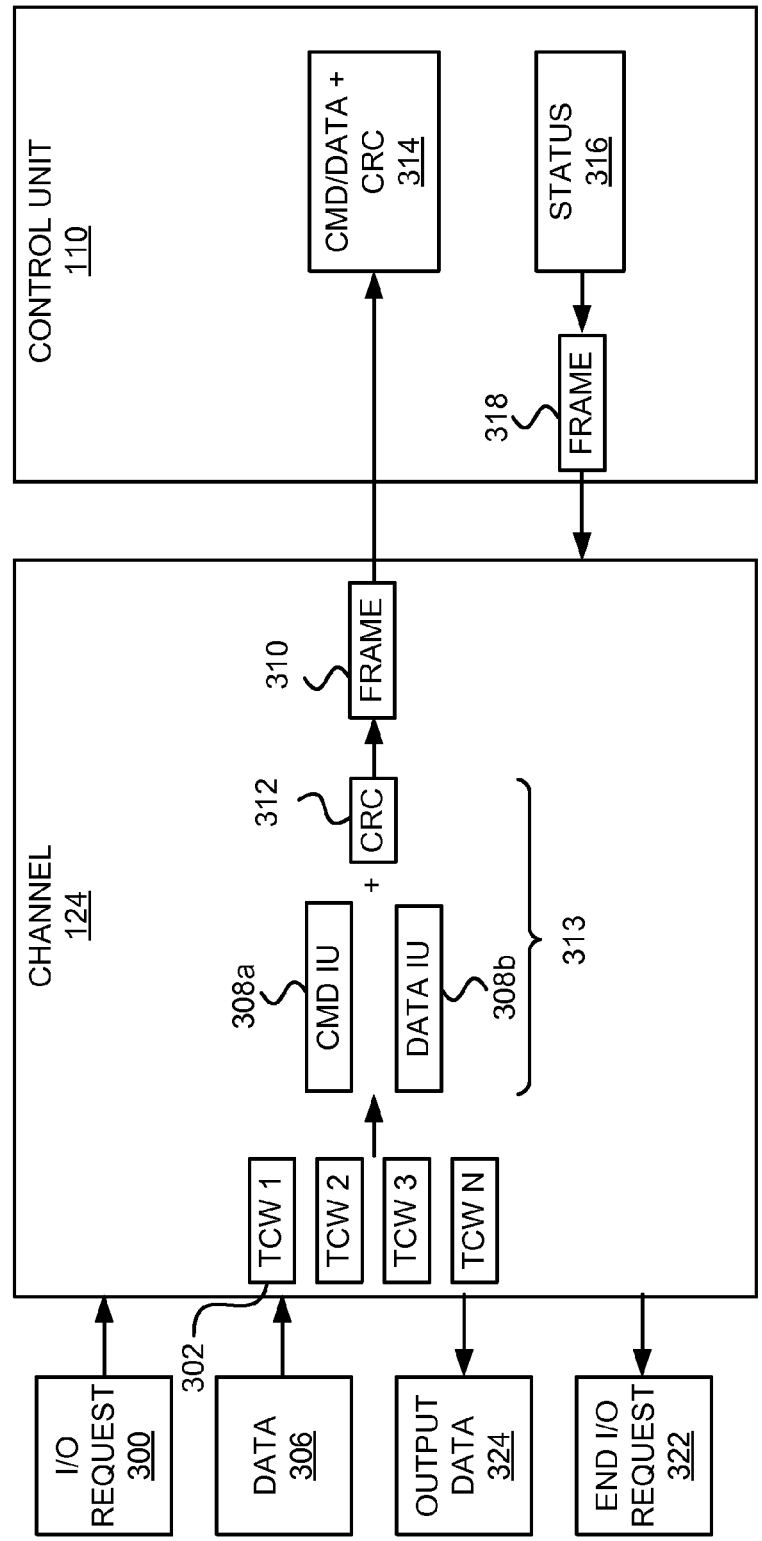
FIG. 3 depicts one embodiment of a link protocol used in communicating between a channel and control unit to execute a transport mode I/O operation.

As illustrated by FIG. 3, the way that transport mode handles an I/O request 300 is different from the way that command mode handles the I/O request 200. While in command mode, each single CCW 202 is sent in separate frames 210 to the control unit 110 for execution. In transport mode, all commands are sent in a single frame 310 to the control unit 110.

Transport mode uses TCWs 302 to set up I/O operations and send command information units 308a to the control unit 110 in a single frame 310. The data associated with the commands is sent in one or more transport data information units 308b. Command codes used in TCWs 302 include, for example, read, write, control, sense, transport and transfer CRC offset block (TCOB) as described below. As with command mode, in transport mode data associated with the execution of the I/O request 300 is transferred between the channel 124 and the control unit 110 in one or more transport data information units 308b. In certain embodiments the channel 124 inserts a CRC 312 at the end of every 4K of data. CRCs 312 are bit patterns added to the data streams to detect any bit changes that may occur to the information unit 308. The insertion of a CRC 312 every 4K allows the control unit 110 to verify the data incrementally, rather than buffer the entire data stream for verification before completing the command 304. In certain embodiments intermediate CRCs 312 can be inserted at designated insert positions as checkpoints to verify the validity of the data rather than appending a single CRC 312 to the end of a message. One of skill in the art will recognize that in other embodiments intermediate CRCs 312 can be inserted at any point where it is desirable to check the accuracy of the information contained within the output data stream.

In certain embodiments the data information units 308b containing the inserted CRCs 312 may be termed a transport data information unit 313. The control unit 110 or another channel 124 rebuilds the incoming frame 310 into an inbound transport data information unit 314. The control unit can check the accuracy of the data 306 using the CRCs 312 contained within the inbound transport data information unit 314 to verify the accuracy of the data contained within the inbound transport data information unit 314. Upon receiving the inbound transport data information unit 314 the control unit 110 may send a status 316 to the channel 124 via frame 318 which closes the exchange.

Figure 4:
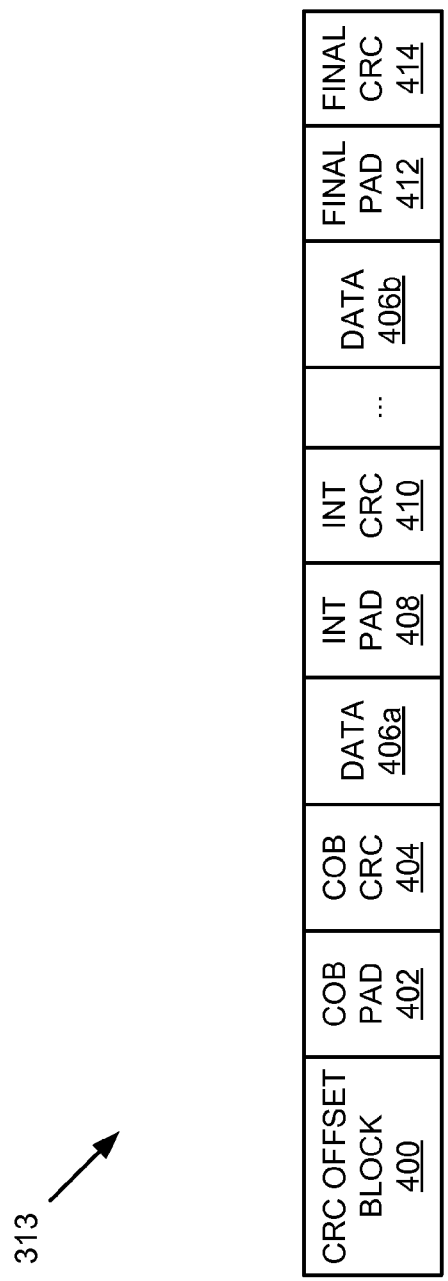
FIG. 4 depicts one embodiment of a transport data information unit incorporating one or more aspects of the present invention.

FIG. 4 illustrates an embodiment of a transport data information unit 313 according to one embodiment of the present invention. In certain embodiments the transport data information unit 313 includes a COB 400, a COB pad byte (s) 402, a COB CRC 404, one or more data blocks 406, an intermediate pad byte(s) 408, an intermediate CRC 410, a final pad byte(s) 412, and a final CRC 414.

As discussed above, in order to check the validity of data blocks 406 intermediate CRCs 410 may be inserted into the transport data information unit 313. In certain embodiments the intermediate CRC 410 is calculated over the data block 406 immediately preceding the intermediate CRC 410. In one embodiment an intermediate CRC 410 is inserted at the end of every 4K of data block 406 in the transport data information unit 313. In other embodiments an intermediate CRC 410 can be inserted in the transport data information unit 313 at designated insert positions as checkpoints to verify the validity of the data before rather than appending a single final CRC 414 to the end of a transport data information unit 313. One of skill in the art will recognize that in certain embodiments intermediate CRCs 312 can be inserted at any point within the output data stream where it is desirable to check the accuracy of the information contained within the transport data information unit 313.

In certain embodiments, such as where the intermediate CRC 410 is inserted at designated positions within the transport data information unit 313 a gap between the data block 406 and the intermediate CRC 410 may exist. To fill this gap, an intermediate pad byte 410 or bytes may be inserted between the data block 406 and the intermediate CRC 410. In certain embodiments the intermediate CRC 410 may be on a four byte boundary. Therefore, in such an embodiment, the maximum number of intermediate pad bytes 408 is three. While the embodiment illustrate in FIG. 4 only contains a single intermediate CRC 410, one of skill in the art will recognize that in other embodiments the transport data information unit 313 may contain multiple intermediate CRCs 410 following multiple data blocks 406.

A final CRC 414 may be included at the end of the transport data information unit 313. In certain embodiments, where intermediate CRCs 410 are not included in the transport data information unit 313, the final CRC 414 may be used to verify the validity of the data blocks 406 in the entire transport data information unit 313. Where an intermediate CRC 410 has been provided in the transport data information unit 313, the final CRC 414 may be generated only over the data 406 transferred after the last intermediate CRC 410. Where there is a gap between the final CRC 414 and the last data block 406, a final pad byte 412 or bytes may be inserted between the final CRC 414 and the last data block 406 in the transport data information unit 313.

In certain embodiments the transport data information unit 313 also includes a COB 400. The COB 400 contains a list of 1-word values identifying the offset of each intermediate CRC 410 within the transport data information unit 313. Each of the 1-word values in the COB 400 indicates the relative offset, in bytes, from the first byte of data that follows a COB CRC 404, when the COB 400 is present in the data IU 308b. For example, in the embodiment illustrated in FIG. 4 the COB 400 includes a 1-word value identifying the offset, in bytes, of intermediate CRC 410 from the first byte of data in the first data block 406a. Embodiments which include additional intermediate CRCs 410 may also include additional 1-word values identifying the offsets of such additional intermediate CRCs 410. As discussed above, in certain embodiments data is sent in more than one transport data information units 308b. In such embodiments the offset is the relative offset, in bytes, from the first byte of data in a first transport data information unit 313 sent from the channel 124 to the control unit 110.

A COB CRC 404 may be inserted into transport data information unit 313 to verify the data contained within the COB 400. In certain embodiments the COB CRC 404 may also be on a four byte boundary. Where there is a gap between the COB 400 and the COB CRC 404, a COB pad byte 402 or bytes may be inserted between the COB 400 and the COB CRC 404 in the transport data information unit 313.

One of skill in the art will recognize that where pad bytes, such as COB pad bytes 402, intermediate pad bytes 408, or final pad byte 412, are used, the corresponding CRCs (COB CRC 404, intermediate CRC 410, and final CRC 414 respectively) may be calculated across both the pad bytes as well as the underlying data. Pad bytes, such as COB pad bytes 402, intermediate pad bytes 408, or final pad byte 412 are contained in the last word of a data are for which a CRC is to be calculated and are typically used to pad the data area to the next word boundary.

In certain embodiments the commands contained within TCW 302 may include a TCOB command which specifies a transfer of the COB 400. The location of the COB 400 is determined by a control data count. The control data count is used to identify the number of bytes occupied by control data in the transport command information unit 308a. Where the control data count is nonzero, the COB 400 may be located in a command block immediately following the TCOB command word 418. Where the control data count 416 is zero, the COB 400 may be provided in the data information unit itself such as the transport data information unit 308b as illustrated in FIG. 4.

Figure 5:
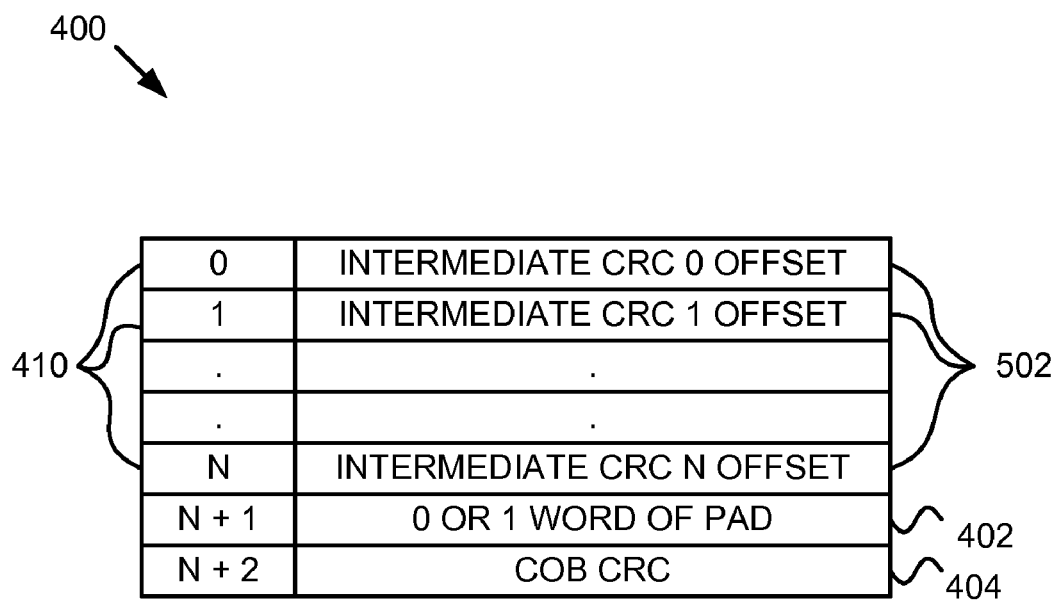
FIG. 5 depicts one embodiment of a format of the COB in accordance with the present invention.

FIG. 5 illustrates an embodiment of a format of the COB 400. In certain embodiments the COB 400 format includes intermediate CRC offsets 502 corresponding to each intermediate CRC 410. The COB 400 also includes zero or one word of COB pad 402 and a COB CRC 404.

The COB 400 contains 1 to N words of intermediate CRC offsets 502 where N is the total number of intermediate CRCs 410 in the transport data information unit 313. Each intermediate CRC offset 502 in the COB 400 indicates the relative offset of the corresponding intermediate CRC 410, in bytes, from the first byte of data following the COB, PAD, and COB CRC, when present, in the data information unit 308b. Thus, in certain embodiments the intermediate CRC offsets 502 are calculated as a value identifying the difference between the location of the intermediate CRC 410 and the location of a first byte of data following the COB CRC 404. For example, referring to FIG. 4, the intermediate CRC 0 offset 502 is calculated as a value identifying the difference between the location of the first intermediate CRC 410 and the location of a first byte of data in data block 406a. The next CRC offset, the CRC 1 Offset 502 would be calculated over the next data block (not shown).

The COB 400 may also include a COB pad 402 word. The COB pad 402 is used to change the location of the COB CRC 404 such that the COB CRC 404 is positioned on a word boundary. Where the COB 400 ends at a location that would place the COB CRC 404 at a word boundary the COB pad 402 may be omitted.

The COB CRC 404 provides a means for verifying the accuracy of the intermediate CRC offsets 502. The COB CRC 404 may be calculated over the data comprising the intermediate CRC offsets 502 and where a COB pad word 408 is included the COB CRC 404 may also be calculated to include the data contained within the COB pad word 408.

As discussed above, in certain embodiments the COB 400 may be included in a control data block in the command information unit 308a rather in the data information unit 308b. In such an embodiment the COB CRC 404 may be omitted. The COB pad word 408 may still be included so that the next DCW is located on a double word boundary.

Figure 6:
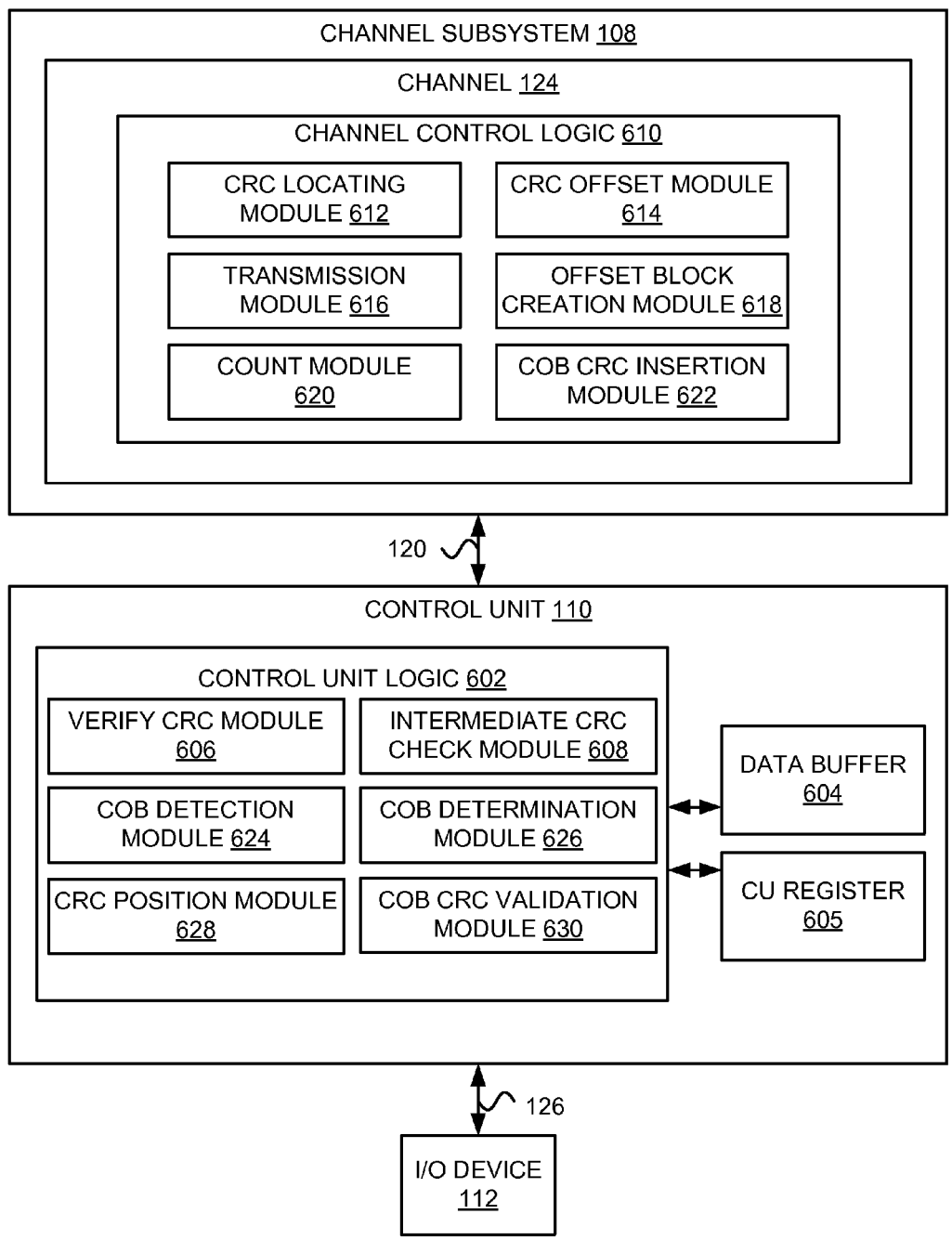
FIG. 6 is a schematic block diagram illustrating one embodiment of an apparatus for locating an intermediate CRC in a data stream sent from a channel subsystem to a control unit of an I/O processing system in accordance with the present invention.

FIG. 6 illustrates one embodiment of channel 124 in the channel subsystem 108, the control unit 110, and the I/O device 112 of FIG. 1 in greater detail. The control unit 110 includes control unit logic 602 to parse and process messages and data contained within the information units 308 such as transport data information unit 308b and command information unit 308a of FIG. 3 received via the connection 120 between the channel 124 and the control unit 110. The control unit logic 602 can extract DCWs and control data from the information units 308 and send such DCWs and control data to control a device such as I/O device 112 via connection 126. The control unit logic 602 sends device commands and data to the I/O device 112 and receives status information and other feedback from the I/O device 112. When the control unit 110 receives data the control unit logic 602 writes the data received into buffer 604 for temporary storage. As data is received the verify CRC module 606 calculates CRC values to verify the integrity of the data. Once the verify CRC module 606 has verified the integrity of the data the control unit 110 can forward the verified data to the I/O device 112.

The control unit COB detection module 624 detects the presence of a COB 400 within a data stream in response to receiving a TCOB device command word in a transport command area of an information unit 308. Where the control unit COB detection module 624 detects the presence of a COB 400 in a data stream the control unit location determination module may be configured to determine the location of the COB 400 based on a control data count in the information unit 308. Where the control data count is a non-zero value, the COB 400 may be located in a transfer command area immediately following the TCOB command in a command information unit 308a. In another embodiment, where the control data count has a zero value, the COB 400 may be located in a data information unit 308b.

In an exemplary embodiment a control unit CRC position location module 628 may be configured to locate the position of the intermediate CRCs 410 within the transport data information unit 313 using the CRC offset values 502 contained within the COB 400. In this manner, a control unit 110 may efficiently locate the position of each intermediate CRC 410 within the transport data information unit 313.

In certain embodiments the control unit logic 602 may include a COB CRC validation module 630. The COB CRC validation module 630 may be configured to perform the calculations necessary to validate the CRC offset values 502 contained within the COB 400 to make sure that the COB 400 contains valid data.

In certain embodiments the location of the intermediate CRCs 410 are known by the control unit 110 and the control unit logic 602 includes an intermediate check CRC module 608 that compares the known location of a CRC 410 with the location of the CRC indicated in the COB 400. In certain embodiments the CRC 410 may be specific to an I/O device 112 and/or a command being executed. Where the CRC check module 608 determines that an intermediate CRC 410 is at a location that is different than the location indicated in the COB 400 or that an intermediate CRC 410 is at a location that is inappropriate for the I/O device 112 and/or command being executed, the CRC check module 608 presents a program check status to the channel 124. The program check status notifies the channel 124 that an error occurred during the processing of the I/O request.

During the processing of an I/O request, a content error is identified when certain conditions occur. For example, errors associated with a DCW specifying a TCOB include a TCOB command received that is not the first DCW in a transport command area (TCA), more than one TCOB command in the TCA, a count error where both the control data count 416 and the DCW device count are either zero or nonzero, a TCOB command is the only DCW in the TCA, a TCOB command was encountered when the W-bit of the TCA header is zero, a TCOB command was the only DCW in the TCA, a TCOB command has a nonzero control data or data count that is not a multiple of four.

The control unit logic 602 accesses and controls other elements within the control unit 110, such as control unit registers 605. The control unit registers 605 can include fixed values that provide configuration status information, as well as dynamic status information that is updated as commands are executed by the control unit logic 602. The control unit 110 may further include other queue or memory elements (not depicted) for storing additional message or status information associated with communications between the channel 124 and the I/O device 112.

The channel 124 in the channel subsystem 108 includes elements to support communication with the control unit 110. For example, the channel 124 may include channel control logic 610 that interfaces with the various modules having logic to insert a COB 400, COB CRC 404 and COB PAD 402 into an information unit 308. In an exemplary embodiment, the channel control logic 610 controls communication between the channel subsystem 108 and the control unit 110. The channel control logic 610 may directly interface with the control unit logic 602 via the connection 120 to send commands and receive responses, such as transport commands and response information units. Alternatively, messaging interfaces and/or additional buffers (not depicted) can be placed between the channel control logic 610 and the control unit logic 602. The channel control logic 610 includes logic to recognize transmission formatting requests, for example, requests to insert intermediate CRCs 410, a COB 400, a COB CRC 404, or COB pad byte(s) 402 into the data output stream.

In one embodiment the channel control logic 610 includes a CRC locating module 612, a CRC offset module 614, a transmission module 616, and an offset block creation module 618.

The CRC locating module 612 includes logic to locate an intermediate CRC 410 in a transport data information unit 313. Where the transport data information unit 313 includes multiple intermediate CRCs 410, the CRC locating module 612 includes logic to locate each intermediate CRC 410 within the transport data information unit 313. The CRC offset module 614 includes logic to determine a CRC offset 502 for each intermediate CRC 410 in the transport data information unit 313. Each CRC offset 502 is a 1-word value identifying the difference, in bytes, between the location of each intermediate CRC 410 and the location of the first byte of data in the transport data information unit 313. In certain embodiments the first byte of data in the transport data information unit 313 is the first byte of data following a COB CRC 404. The offset block creation module 618 includes logic to create a COB 400 which includes the CRC offsets 502 as determined by the CRC offset module 614. The transmission module 616 may directly communicate with the control unit logic 602 via the connection 120 to send and receive information units 308 which include a COB 400. Alternatively, messaging interfaces and/or additional buffers (not depicted) can be placed between the transmission module 616 and the control unit logic 602.

As discussed above, in certain embodiments the commands 304 contained within a TCW 302 may include a TCOB command which specifies a transfer of the COB 400. The location of the COB 400 is determined by a control data count which identifies the number of bytes occupied by control data in the information unit 308. In certain embodiments the channel control logic 610 also includes a count module 620 that contains logic to determine the control data count. Where the control data count is nonzero, the COB 400 may be located in a command block immediately following the TCOB command word 418. Where the control data count 416 is zero, the COB 400 may be provided in the data information unit 308*b*.

In one embodiment the channel control logic 610 includes a COB CRC insertion module 622. The COB CRC insertion module includes logic to insert a COB CRC 404 into the transport data information unit 313. The COB CRC 404 may be inserted into transport data information unit 313 to verify the data contained within the COB 400. The COB CRC 404 is calculated across the data contained within the COB 400. Where a COB pad byte 404 or bytes is included in the transport data information unit 313, the COB CRC 404 may also be calculated across the COB pad byte 404 or bytes.

Figure 7:
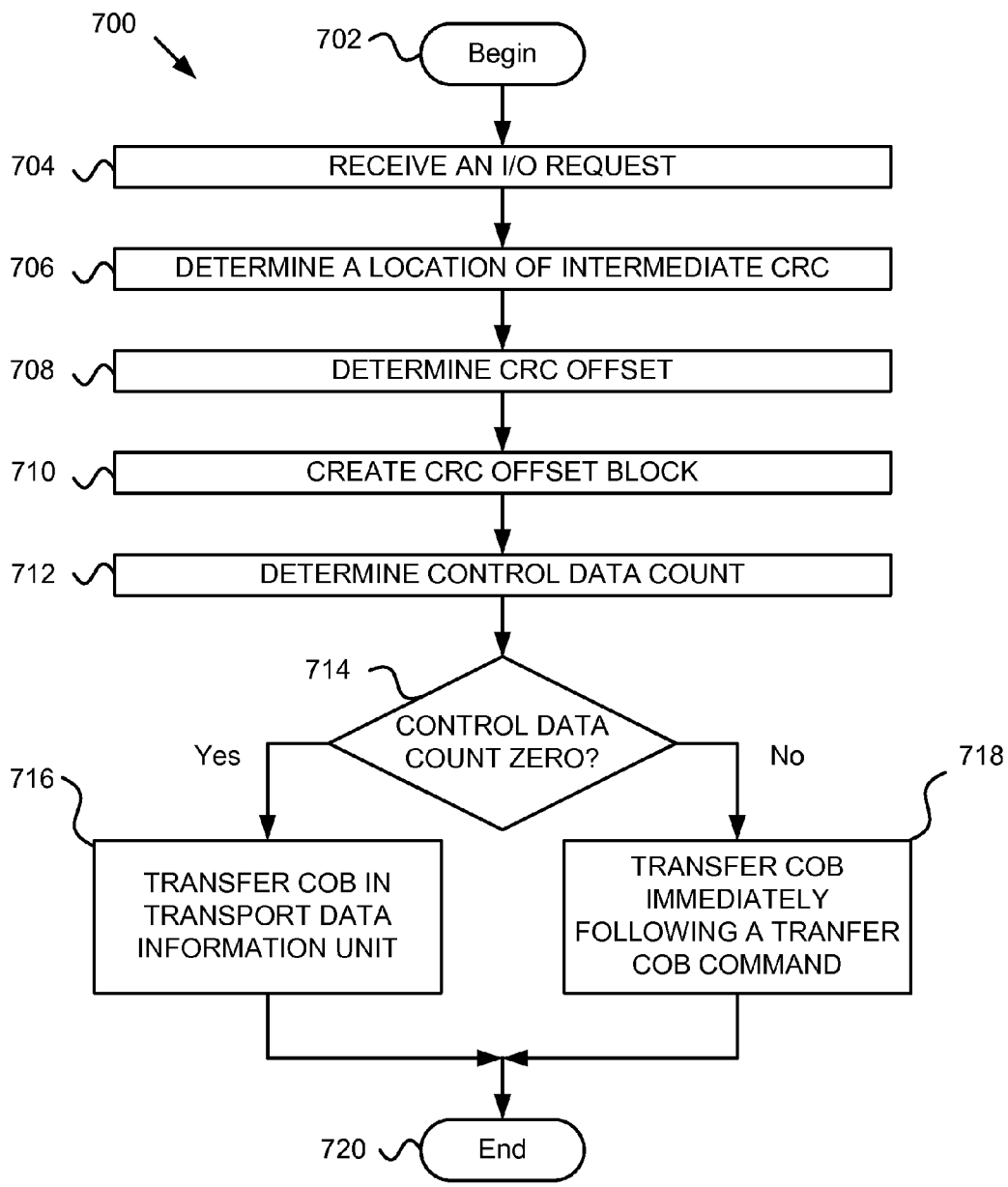
FIG. 7 is a schematic flow chart diagram illustrating one embodiment of a method for locating an intermediate CRC in a data stream and determining the appropriate location to position a COB in the data stream sent from a channel subsystem to a control unit of an I/O processing system in accordance with the present invention.

Turning now to FIG. 7, a method 700 for locating a CRC in a data stream from the channel subsystem 108 to a control unit 110 of an I/O processing system 100 will now be described in accordance with exemplary embodiments, and in reference to the I/O processing system of FIG. 1.

The method 700 begins 702 and an I/O request such as the I/O request 300 discussed above in relation to FIG. 3, is received 704 at a channel subsystem 108. In certain embodiments the I/O request 300 may be a request to transmit a transport data information unit such as transport data information unit 313 of FIG. 3.

The CRC locating module 612 of the channel control logic 610 determines 706 the location of the intermediate CRCs 410 contained within the transport data information unit 313. In certain embodiments the CRC locating module 612 may interface with a CRC insertion module (not shown) to record the location of each intermediate CRC 410 as the intermediate CRC 410 is inserted into the transport data information unit 313.

A CRC offset is determined 708 by determining the difference between the location of the intermediate CRC 410 and the location of the first byte of data 406 in the transport data information unit 313. One of skill in the art will recognize that reference herein to the first byte of data 406 includes the payload data being transferred to the control unit 110. Thus, in certain embodiments, such as where the transport data information unit 313 includes a COB CRC 404, the first byte of data 406 is the first byte of data 406 following the COB CRC 404. In one embodiment, such as where the transport data information unit 313 does not include a COB CRC 404, the CRC offset may be determined as the difference between the first byte of data 406 following the COB 400 and the location of the intermediate CRC 410.

A COB, such as COB 400 is created 710 by the channel control logic 610. The COB 400 includes a CRC offset value for each intermediate CRC 410 in the transport data information unit 313. As discussed above, the COB 400 provides an efficient mechanism for a control unit 110 or I/O device 112 to determine the location of each intermediate CRC 410 in the transport data information unit 313. Thus, the control unit 110 or I/O device 112 can efficiently check the accuracy of the data 406 in the transport data information unit 313.

The COB 400 may be located in either a data information unit 308*b* or as control data in a transport command area of a command information unit 308*a*. Therefore, in certain embodiments the method 700 includes determining 712 a control data count to determine where to locate the COB 400. As illustrated at block 714, if the control data count is zero the COB 400 is transferred 716 in the transport data information unit 313 and the method ends 720. If the control data count is non-zero the COB 400 is transferred 718 in a command immediately following a transfer COB command in the transport command area of a transport command information unit 308*a* and the method ends 720.

Figure 8:
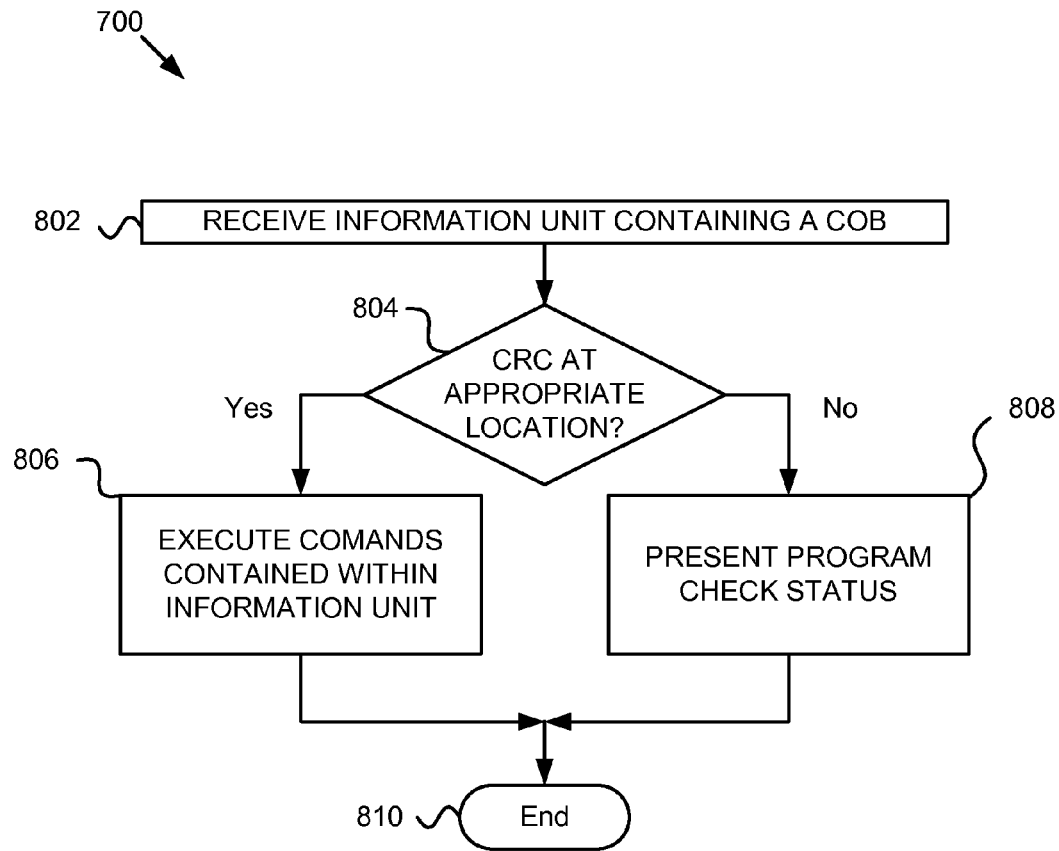
FIG. 8 is a schematic flow chart diagram illustrating one embodiment of a method for verifying that the at least one intermediate CRC is located at an appropriate location in a data stream sent from a channel subsystem to a control unit of an I/O processing system in accordance with the present invention.

As illustrated in FIG. 8, in certain embodiments the method 700 includes the operations performed at the control unit 110 or the I/O device 112. For example, in certain embodiments the control unit 110 may receive 802 the information unit 308 (transfer data information unit 308*b* or transport command information unit 308*a*) including the COB 400 from the channel 124. In certain embodiments the intermediate CRCs 410 may be located throughout the transfer data information unit 313 at a predetermined location depending on the I/O device 112 and/or command being executed. Therefore, in certain embodiments the appropriate location of the intermediate CRCs 410 may be known by the control unit 110. At block 804 the values in the COB 400 may be compared to the known location of the CRC 400. If the value of the CRC offset in the COB 400 is appropriate for the I/O device 112 and/or the command being executed, the control unit 110 or I/O device 112 executes 806 the commands contained within the information units 308 and the method ends 810. If the control unit 110 determines that one or more entries in the COB 400 indicate that an intermediate CRC 410 is not a location that is appropriate for the I/O device 112 and/or the command being executed, the control unit 110 may present 808 a program check status to the channel 124 and the method ends 810.

Using the method, system and apparatus described herein an I/O device 112 is able to determine the locations of the intermediate CRCs 410 independent of the device commands so that CRC checking can be done without first processing the commands.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An apparatus to locate an intermediate cyclic redundancy check (CRC) in a data stream sent from a channel subsystem to a control unit of an input/output (I/O) processing system, the apparatus comprising:
   a CRC locating module configured to determine a location of at least one intermediate CRC within a transport data information unit;
   a CRC offset module configured to determine a CRC offset of the at least one intermediate CRC, the CRC offset comprising a value identifying a difference between the location of the at least one intermediate CRC and a location of a first byte of data in a first transport data information unit;
- an offset block creation module configured to create a CRC offset block (COB), the COB comprising a CRC offset value for each of the at least one intermediate CRC within the transport data information unit; and
- a transmissions module configured to transmit the COB from the channel subsystem to the control unit.

2. The apparatus of claim 1, further comprising a count module, the count module configured to determine a control data count, wherein the COB is transferred in a transport command area immediately following a transfer COB (TCOB) command in response to the count module determining that the control data count comprises a non-zero value.

3. The apparatus of claim 1, further comprising a count module, the count module configured to determine a control data count, wherein the COB is transferred in the transport data information unit in response to the count module determining that the control data count comprises a zero value.

4. The apparatus of claim 1, further comprising a COB CRC insertion module configured to insert a COB CRC following the COB, the COB CRC comprising a CRC calculated over the at least one CRC offset value comprising the COB.

5. The apparatus of claim 4, wherein the CRC offset comprises a relative offset, in bytes, from the first byte of data following the COB CRC in the transport data information unit.

6. The apparatus of claim 4, wherein COB CRC insertion module is further configured to insert a pad byte between the COB and the COB CRC, the pad byte configured to extend the COB CRC to a double word boundary.

7. An apparatus to locate an intermediate cyclic redundancy check (CRC) in a data stream sent from a channel subsystem to a control unit of an input/output (I/O) processing system, the apparatus comprising:
- a control unit CRC offset block (COB) detection module configured to detect the presence of a COB in a data stream, the COB comprising a CRC offset value for at least one intermediate CRC within a transport data information unit, the CRC offset value comprising a value identifying a difference between the location of the at least one intermediate CRC and a location of a first byte of data in a first transport data information unit in the data stream;
- a control unit COB location determination module configured to determine the location of the COB; and
- a control unit CRC position location module configured to locate a position of the at least one intermediate CRC within the transport information unit using the CRC offset value for the least one intermediate CRC.

8. The apparatus of claim 7, wherein the control unit COB detection module detects the presence of a COB in response to receiving a transfer COB (TCOB) command word.

9. The apparatus of claim 7, wherein the control unit COB location determination module determines the location of the COB based on a control data count, wherein the COB is located in a transport command area immediately following the TCOB command where the control data count comprises a non-zero value.

10. The apparatus of claim 7, wherein the control unit COB location determination module determines the location of the COB based on a control data count, wherein the COB is located in the transport data information unit where the control data count comprises a zero value.

11. The apparatus of claim 10, further comprising a control unit COB CRC validation module configured to validate a COB CRC, the COB CRC comprising a CRC calculated over the CRC offset values comprising the COB.

12. The apparatus of claim 10, further comprising an intermediate CRC check module configured to compare a known location of the at least one intermediate CRC with the CRC offset value in the COB for a corresponding at least one intermediate CRC, the intermediate CRC check module further configured to present a program check status in response to the intermediate CRC check module determining that the at least one intermediate CRC is at a location that is inappropriate for a device or a command being executed.

13. The apparatus of claim 10, further comprising a verify CRC module configured to calculate a CRC value for the at least one CRC in the transport data information unit to verify the integrity of data within the transport data information unit.

14. A method for locating a cyclic redundancy check (CRC) in a data stream sent from a channel subsystem to a control unit of an input/output (I/O) processing system, the method comprising:
- determining, using a processor, a location of at least one intermediate CRC within the transport data information unit;
- determining a CRC offset of the at least one intermediate CRC, the CRC offset comprising a value identifying a difference between a location of the at least one intermediate CRC and a location of a first byte of data in the transport data information unit;
- creating a CRC offset block (COB), the COB comprising a CRC offset value for each of the at least one intermediate CRC's within the transport data information unit;
- determining a control data count; and
- transmitting the COB to the control unit in the transport data information unit in response to determining that the control data count comprises a zero value.

15. The method of claim 14, further comprising transferring the COB in a transport command area immediately following a transfer COB (TCOB) device command word in response to determining that the control data count comprises a non-zero value.

16. The method of claim 14, further comprising inserting a COB CRC into the transport data information unit, the COB CRC comprising a CRC calculated over the list of CRC offset values comprising the COB.

17. The method of claim 14, further comprising comparing a known location of the at least one intermediate CRC with the CRC offset value in the COB for the corresponding at least one intermediate CRC and presenting a program check status in response to determining that the at least one intermediate CRC is at a location that is inappropriate for a device or command being executed.

18. A method for locating a cyclic redundancy check (CRC) in a data stream sent from a channel subsystem to a control unit of an input/output (I/O) processing system, the method comprising:
- detecting, using a processor, the presence of a COB in a data stream, the COB comprising a CRC offset value for at least one intermediate CRC within a transport data information unit, the CRC offset value comprising a value identifying a difference between the location of the at least one intermediate CRC and a location of a first byte of data in a first transport data information unit in the data stream;
- determining the location of the COB; and locating a position of the at least one intermediate CRC within the transport information unit using the CRC offset value for the least one intermediate CRC.

19. The method of claim 18, wherein the COB is located in a transport command area immediately following a TCOB command where the control data count comprises a non-zero value, wherein the COB is located in the transport data information unit where the control data count comprises a zero value.

20. The method of claim 18, comparing a known location of the at least one intermediate CRC with the CRC offset value in the COB for a corresponding at least one intermediate CRC and presenting a program check status in response to the intermediate CRC check module determining that the at least one intermediate CRC is at a location that is inappropriate for a device or a command being executed.

21. A computer program product comprising a non-transitory computer readable medium having computer usable program code executable to perform operations for locating a cyclic redundancy check (CRC) in a data stream of an input/output (I/O) processing system, the operations of the computer program product comprising:
- receiving an I/O request to transmit a transport data information unit at a channel subsystem;
- determining a location of at least one intermediate CRC within the transport data information unit;
- determining a CRC offset of the at least one intermediate CRC, the CRC offset comprising a value identifying a difference between a location of the at least one intermediate CRC and a location of a first byte of data in the transport data information unit;
- creating a CRC offset block (COB), the COB comprising a CRC offset value for each of the at least one intermediate CRC's within the transport data information unit; and
- transmitting the COB from the channel subsystem to a control unit in response to the I/O request.

22. The computer program product of claim 21, wherein the operations of the computer program product further comprise determining a control data count, wherein the COB is transferred in a transport command area immediately following a transfer COB (TCOB) command in response to determining that the control data count comprises a non-zero value, wherein the COB is transferred in the transport data information unit in response to determining that the control data count comprises a zero value.

23. The computer program product of claim 21, wherein the operations of the computer program product further comprise inserting a COB CRC into the transport data information unit, the COB CRC comprising a CRC calculated over the list of CRC offset values comprising the COB.

24. The computer program product of claim 21, wherein the operations of the computer program product further comprise comparing a known location of the at least one intermediate CRC with the CRC offset value in the COB for the corresponding at least one intermediate CRC and presenting a program check status in response to determining that the at least one intermediate CRC is at a location that is inappropriate for a device or command being executed.

25. The computer program product of claim 21, wherein the operations of the computer program product further comprise calculating a CRC value for the at least one CRC in the transport data information unit to verify the integrity of data within the transport data information unit.

26. A computer program product comprising a non-transitory computer readable medium having computer usable program code executable to perform operations for locating a cyclic redundancy check (CRC) in a data stream of an input/output (I/O) processing system, the operations of the computer program product comprising:
- detecting the presence of a COB in a data stream, the COB comprising a CRC offset value for at least one intermediate CRC within a transport data information unit, the CRC offset value comprising a value identifying a difference between the location of the at least one intermediate CRC and a location of a first byte of data in a first transport data information unit in the data stream;
- determining the location of the COB; and
- locating a position of the at least one intermediate CRC within the transport information unit using the CRC offset value for the least one intermediate CRC.

* * * * *